(12) United States Patent
Peters et al.

(10) Patent No.: US 7,681,165 B2
(45) Date of Patent: Mar. 16, 2010

(54) APPARATUS AND METHODS FOR CONGESTION ESTIMATION AND OPTIMIZATION FOR COMPUTER-AIDED DESIGN SOFTWARE

(75) Inventors: Jason Peters, Toronto (CA); Ketan Padalia, Thornhill (CA); Adrian Ludwin, Toronto (CA)

(73) Assignee: Altera Corporation, San Jose, CA (US)

( * ) Notice: Subject to any disclaimer, the term of this patent is extended or adjusted under 35 U.S.C. 154(b) by 73 days.

(21) Appl. No.: 11/467,975

(22) Filed: Aug. 29, 2006

(65) Prior Publication Data

US 2008/0059931 A1  Mar. 6, 2008

(51) Int. Cl.
*G06F 17/50* (2006.01)
(52) U.S. Cl. ............... 716/9; 716/10; 716/13; 716/14
(58) Field of Classification Search ........... 716/9, 716/10, 13, 14
See application file for complete search history.

(56) References Cited

U.S. PATENT DOCUMENTS

| | | | | |
|---|---|---|---|---|
| 5,495,419 A * | 2/1996 | Rostoker et al. | ............ | 700/121 |
| 5,619,419 A * | 4/1997 | D'Haeseleer et al. | .......... | 716/8 |
| 5,793,644 A * | 8/1998 | Koford et al. | ................. | 716/2 |
| 5,815,403 A * | 9/1998 | Jones et al. | ..................... | 716/9 |
| 5,870,312 A * | 2/1999 | Scepanovic et al. | ........... | 716/10 |
| 5,870,313 A * | 2/1999 | Boyle et al. | .................... | 716/10 |
| 5,875,117 A * | 2/1999 | Jones et al. | ................... | 716/14 |
| 5,914,887 A * | 6/1999 | Scepanovic et al. | .............. | 716/8 |
| 6,155,725 A * | 12/2000 | Scepanovic et al. | ............ | 716/9 |
| 6,493,658 B1 * | 12/2002 | Koford et al. | .................. | 703/1 |
| 6,505,325 B1 * | 1/2003 | Hamamoto | .................... | 716/5 |
| 7,506,295 B1 * | 3/2009 | Teig | ............................ | 716/12 |
| 2001/0047507 A1 * | 11/2001 | Pileggi et al. | .................. | 716/8 |
| 2005/0183046 A1 * | 8/2005 | Dougherty et al. | ............. | 716/2 |
| 2008/0201678 A1 * | 8/2008 | Ang et al. | ....................... | 716/8 |
| 2008/0263497 A1 * | 10/2008 | Mehrotra et al. | .............. | 716/13 |
| 2009/0077522 A1 * | 3/2009 | Frankle et al. | ................ | 716/12 |

OTHER PUBLICATIONS

NNRD454151, "Congestion Driven Placement System Using Mid-Cut Partitioning", IBM technical Disclosure Bulletin, No. 454, Feb. 2002, 3 pages.*
NB82123853, "Connecting Three Points While Minimizing Cost", vol. 25, No. 7B, Dec. 1982, 5 pages.*

* cited by examiner

*Primary Examiner*—Phallaka Kik
(74) *Attorney, Agent, or Firm*—Law Offices of Maximilian R. Peterson

(57) ABSTRACT

A method of performing placement of resources in a computer-aided design (CAD) tool includes performing a first congestion analysis, proposing a placement move, and evaluating the placement move. The method further includes incrementally updating information used for performing another congestion analysis.

35 Claims, 12 Drawing Sheets

Congestion from = TotalCongestion(4,3)
(2,2) to (4,3)  − TotalCongestion(4,1)
                − TotalCongestion(1,3)
                + TotalCongestion (1,1)

| 0 | 2  | 5  | 5  | 2 |
|---|----|----|----|---|
| 2 | 5  | 15 | 15 | 5 |
| 2 | 10 | 25 | 25 | 5 |
| 0 | 2  | 5  | 15 | 2 |
| 0 | 0  | 5  | 5  | 0 |

=

| 4 | 23 | 78 | 143 | 157 |
|---|----|----|-----|-----|
| 4 | 21 | 71 | 131 | 143 |
| 2 | 14 | 49 | 94  | 101 |
| 0 | 2  | 12 | 32  | 34  |
| 0 | 0  | 5  | 10  | 10  |

= 143

−

| 4 | 23 | 78 | 143 | 157 |
|---|----|----|-----|-----|
| 4 | 21 | 71 | 131 | 143 |
| 2 | 14 | 49 | 94  | 101 |
| 0 | 2  | 12 | 32  | 34  |
| 0 | 0  | 5  | 10  | 10  |

− 34

| 4 | 23 | 78 | 143 | 157 |
|---|----|----|-----|-----|
| 4 | 21 | 71 | 131 | 143 |
| 2 | 14 | 49 | 94  | 101 |
| 0 | 2  | 12 | 32  | 34  |
| 0 | 0  | 5  | 10  | 10  |

− 21

+

| 4 | 23 | 78 | 143 | 157 |
|---|----|----|-----|-----|
| 4 | 21 | 71 | 131 | 143 |
| 2 | 14 | 49 | 94  | 101 |
| 0 | 2  | 12 | 32  | 34  |
| 0 | 0  | 5  | 10  | 10  |

APPARATUS AND METHODS FOR CONGESTION ESTIMATION AND OPTIMIZATION FOR COMPUTER-AIDED DESIGN SOFTWARE

TECHNICAL FIELD

The disclosed concepts relate to apparatus and methods for computer-aided design (CAD). More specifically, the concepts relate to apparatus and methods for congestion estimation and optimization for placement in CAD software for integrated circuits (ICs), such as programmable logic devices (PLDs).

BACKGROUND

CAD software assists designers during many parts of the design of an electronic apparatus, implementation of a circuit, or using the apparatus. Examples might include IC design or implementing a user's circuit using the resources within a PLD.

One aspect of the design typically relates to routing and placement of the design. For example, a user might synthesize his or her circuit, and then wish to route the various resources used to implement the design, and to place the resources within the floorplan of the chip. Traditionally, the placement of the resources has been computationally intensive. Although the speed of processing has steadily increased, so has the size and complexity of the CAD problems. A need therefore exists for more efficient and optimal CAD techniques.

SUMMARY

One aspect of the inventive concepts relates to a method of performing placement of resources. In one exemplary embodiment, the method includes performing a first congestion analysis, proposing a placement move, and evaluating the placement move. The method further includes incrementally updating information used for performing another congestion analysis.

Another aspect of the invention relates to a system performing placement of resources, where the system includes a computer configured to perform the placement method described above. Yet another aspect of the inventive concepts pertains to computer program products that include computer applications adapted for processing by a computer for resource placement. The computer applications cause the computer to perform the resource placement method described above.

BRIEF DESCRIPTION OF THE DRAWINGS

The appended drawings illustrate only exemplary embodiments of the invention and therefore should not be considered or construed as limiting its scope. Persons of ordinary skill in the art who have the benefit of the description of the invention appreciate that the disclosed inventive concepts lend themselves to other equally effective embodiments. In the drawings, the same numeral designators used in more than one drawing denote the same, similar, or equivalent functionality, components, or blocks.

FIG. 8 shows an example of an application of the method of FIG. 7.

DETAILED DESCRIPTION

The inventive concepts contemplate apparatus and associated methods for congestion estimation for software, such as CAD algorithms or software, or CAD software for PLDs and the like. The disclosed concepts seek to provide a more optimal congestion estimation for CAD placement techniques.

Generally speaking, the inventive concepts are applicable to a variety of CAD problems. For example, one may use the concepts for IC design (routing and placement of wires or coupling mechanisms and/or other resources), implementation of a user's circuit (for example, using the resources of a PLD), printed circuit board design, etc.

Most logic design platforms have restrictions on the quantity and distribution of routing wires that may be used in a legal design implementation (i.e., a design or implementation that conforms or meets desired or given constraints, criteria, and/or specifications). For example, a PLD with prefabricated routing wires and switches can should use those resources to create a legal routing. As another example, a structured ASIC device, which has a fixed die area, will typically have a limit on the total amount of wire available, and also the number of routing tracks that may be used in any area of the chip (due to manufacturing spacing rules).

If any region of the chip has competition for more routing resources than are available, the finite amount of resources gives rise to routing congestion. If significant routing congestion exists, the routing phase may take much longer to find a legal routing solution than with a more balanced (less congested) routing distribution. In some cases, it may even be impossible to find a legal routing solution in the presence of relatively high routing congestion.

Creating a placement which minimizes the possibility for routing congestion is therefore a desirable optimization goal, as it can improve routing time and quality, and reduce the likelihood of routing failures. This goal should typically be satisfied in conjunction with other optimization goals, including but not limited to, meeting a user's timing constraints, minimizing power consumption, or minimizing total design area.

Conventional techniques for predicting and minimizing routing congestion during placement typically use incrementally updated models that are too computationally expensive to use in a production CAD flow. The inventive concepts, however, use a combination of incremental and periodic models that are more efficient, yet maintain a sufficient level of accuracy for effective optimization. The techniques generate consistently routable placements for structured ASIC designs, and also improve the routability of many historically hard-to-route PLD or FPGA designs.

Figure 1:
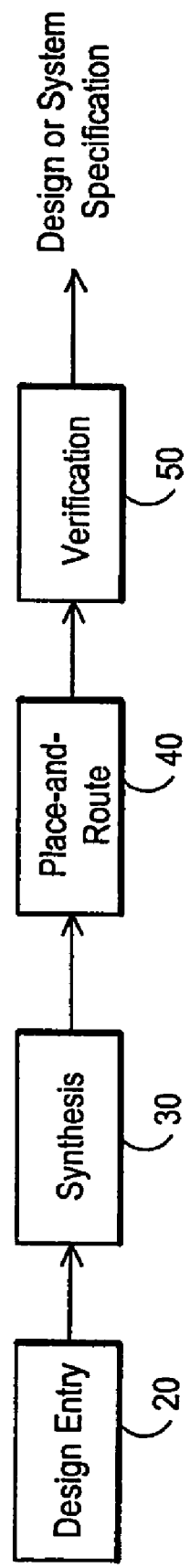
FIG. 1 shows various software modules, one or more of which PLD CAD software according to illustrative embodiments of the invention uses.
Figure 2:
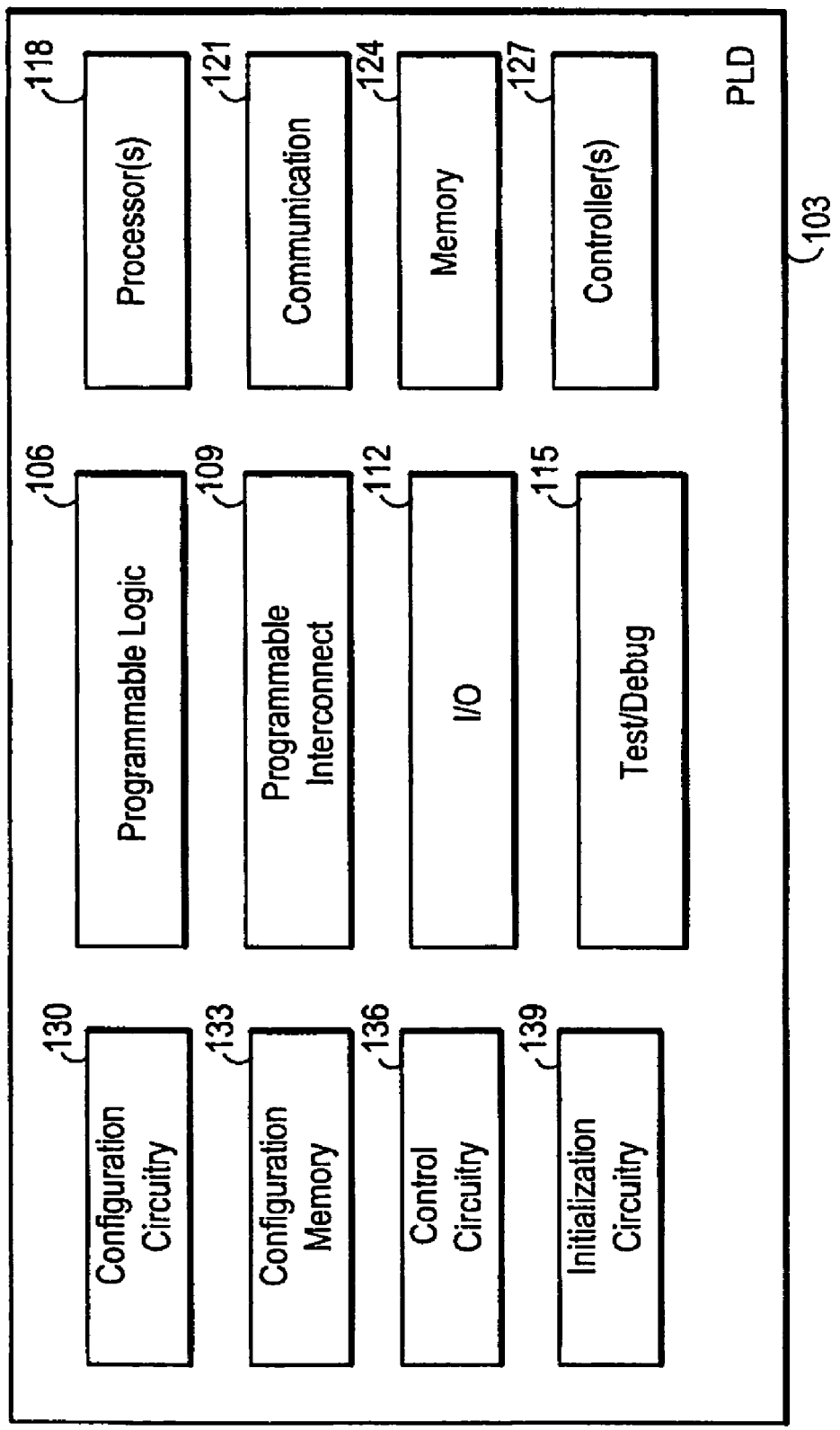
FIG. 2 depicts a general block diagram of a PLD that may be designed or used to implement user's circuits by using the inventive techniques.
Figure 3:
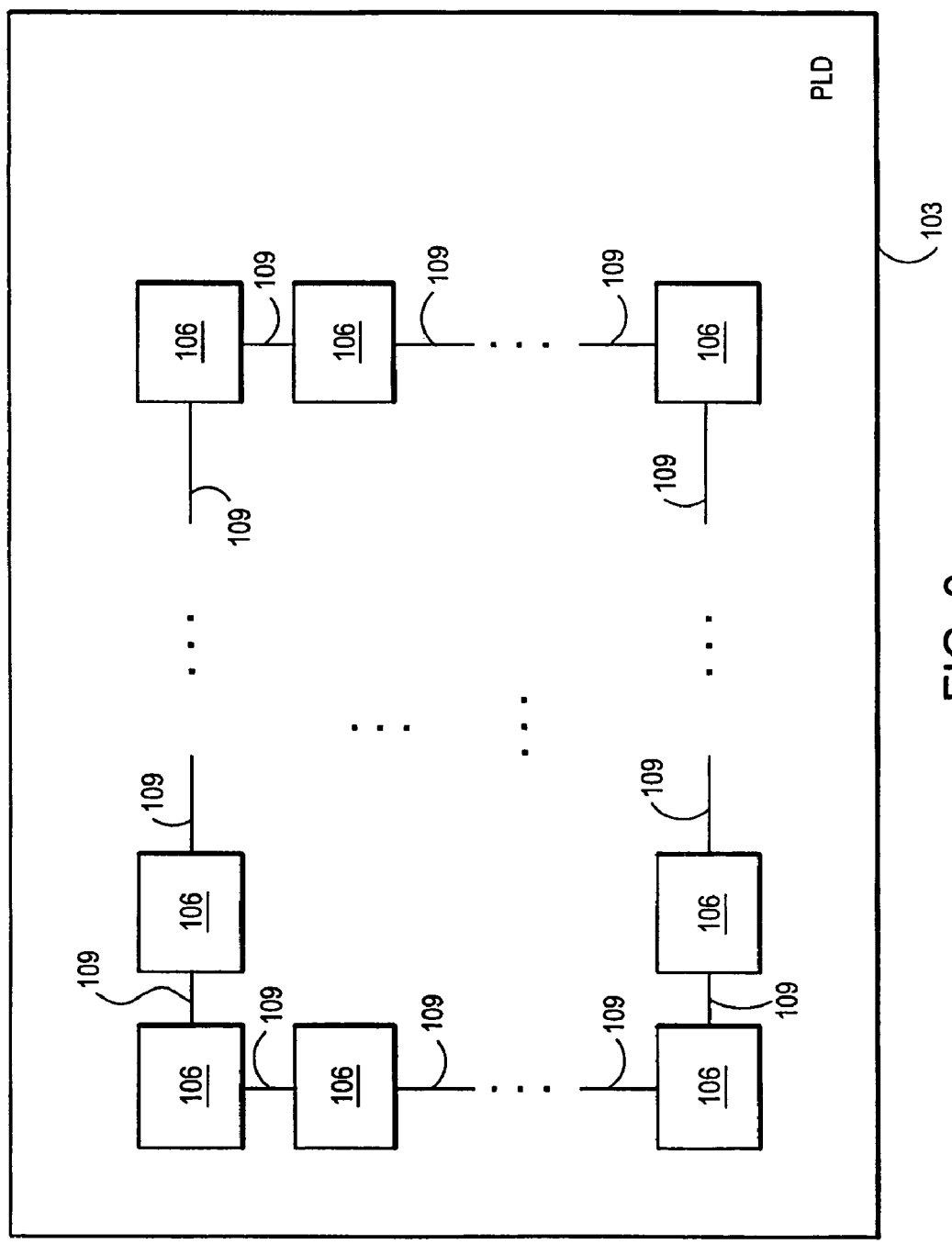
FIG. 3 illustrates a floor-plan of an exemplary PLD that one may design or use to implement desired circuits by using the inventive concepts.

FIGS. 1-3 pertain to exemplary embodiments that relate to PLD design or user-circuit implementation. FIG. 1 illustrates various software modules, one or more of which PLD CAD software according to illustrative embodiments of the invention uses. The modules include design-entry module 20, synthesis module 30, place-and-route module 40, and verification module 50. The following description provides a simplified explanation of the operation of each module.

The CAD techniques may have a variety of applications, as persons of ordinary skill in the art who have the benefit of the description of the invention understand. Examples include design area, timing performance, power requirements, and routability, as desired.

Design-entry module 20 allows the editing of various design description files using graphical or textual descriptions of a circuit or its behavior, such as schematics, hardware description languages (HDL), or waveforms, as desired. The user may generate the design files by using design-entry module 20 or by using a variety of electronic design automation (EDA) or CAD tools (such as industry-standard EDA tools), as desired. The user may enter the design in a graphic format, a waveform-based format, a schematic format, in a text or binary format, or as a combination of those formats, as desired.

Synthesis module 30 accepts the output of design-entry module 20. Based on the user-provided design, synthesis module 30 generates appropriate logic circuitry that realizes the user-provided design. One or more PLDs (not shown explicitly) implement the synthesized overall design or system. Synthesis module 30 may also generate any glue logic that allows integration and proper operation and interfacing of various modules in the user's designs. For example, synthesis module 30 provides appropriate hardware so that an output of one block properly interfaces with an input of another block. Synthesis module 30 may provide appropriate hardware so as to meet the specifications of each of the modules in the overall design or system.

Furthermore, synthesis module 30 may include algorithms and routines for optimizing the synthesized design. Through optimization, synthesis module 30 seeks to more efficiently use the resources of the one or more PLDs that implement the overall design or system. Synthesis module 30 provides its output to place-and-route module 40.

Place-and-route module 40 uses the designer's timing specifications to perform optimal logic mapping and placement. The logic mapping and placement determine the use of routing resources within the PLD(s). In other words, by use of particular programmable interconnects with the PLD(s) for certain parts of the design, place-and-route module 40 helps optimize the performance of the overall design or system. By proper use of PLD routing resources, place-and-route module 40 helps to meet the critical timing paths of the overall design or system.

Place-and-route module 40 optimizes the critical timing paths to help provide timing closure faster in a manner known to persons of ordinary skill in the art with the benefit of the description of the invention. As a result, the overall design or system can achieve faster performance (i.e., operate at a higher clock rate or have higher throughput).

Verification module 50 performs simulation and verification of the design. The simulation and verification seek in part to verify that the design complies with the user's prescribed specifications. The simulation and verification also aim at detecting and correcting any design problems before prototyping the design. Thus, verification module 50 helps the user to reduce the overall cost and time-to-market of the overall design or system.

Verification module 50 may support and perform a variety of verification and simulation options, as desired. The options may include functional verification, test-bench generation, static timing analysis, timing simulation, hardware/software simulation, in-system verification, board-level timing analysis, signal integrity analysis and electro-magnetic compatibility (EMC), formal netlist verification, and the like, as persons of ordinary skill in the art who have the benefit of the description of the invention understand.

Note that one may perform other or additional verification techniques as desired and as persons of ordinary skill in the art who have the benefit of the description of the invention understand. Verification of the design may also be performed at other phases in the flow, as appropriate, and as desired.

FIG. 2 depicts a general block diagram of a PLD that may be designed or used to implement user's circuits by using the inventive techniques. PLD 103 includes configuration circuitry 130, configuration memory (CRAM) 133, control circuitry 136, programmable logic 106, programmable interconnect 109, and I/O circuitry 112. In addition, PLD 103 may include test/debug circuitry 115, one or more processors 118, one or more communication circuitry 121, one or more memories 124, one or more controllers 127, and initialization circuit 139, as desired.

Note that the figure shows a simplified block diagram of PLD 103. Thus, PLD 103 may include other blocks and circuitry, as persons of ordinary skill in the art understand. Examples of such circuitry include clock generation and distribution circuits, redundancy circuits, and the like. Furthermore, PLD 103 may include, analog circuitry, other digital circuitry, and/or mixed-mode circuitry, as desired.

Programmable logic 106 includes blocks of configurable or programmable logic circuitry, such as look-up tables (LUTs), product-term logic, multiplexers (MUXs), logic gates, registers, memory, and the like. Programmable interconnect 109 couples to programmable logic 106 and provides configurable interconnects (coupling mechanisms) between various blocks within programmable logic 106 and other circuitry within or outside PLD 103.

Control circuitry 136 controls various operations within PLD 103. Under the supervision of control circuitry 136, PLD configuration circuitry 130 uses configuration data (which it obtains from an external source, such as a storage device, a host, etc.) to program or configure the functionality of PLD 103. Configuration data are typically used to store information in CRAM 133. The contents of CRAM 133 determine the functionality of various blocks of PLD 103, such as programmable logic 106 and programmable interconnect 109. Initialization circuit 139 may cause the performance of various functions at reset or power-up of PLD 103.

I/O circuitry 112 may constitute a wide variety of I/O devices or circuits, as persons of ordinary skill in the art who have the benefit of the description of the invention understand. I/O circuitry 112 may couple to various parts of PLD 103, for example, programmable logic 106 and programmable interconnect 109. I/O circuitry 112 provides a mechanism and circuitry for various blocks within PLD 103 to communicate with external circuitry or devices.

Test/debug circuitry 115 facilitates the testing and troubleshooting of various blocks and circuits within PLD 103. Test/debug circuitry 115 may include a variety of blocks or circuits known to persons of ordinary skill in the art who have the benefit of the description of the invention. For example, test/debug circuitry 115 may include circuits for performing tests after PLD 103 powers up or resets, as desired. Test/debug circuitry 115 may also include coding and parity circuits, as desired.

PLD 103 may include one or more processors 118. Processor 118 may couple to other blocks and circuits within PLD 103. Processor 118 may receive data and information from circuits within or external to PLD 103 and process the information in a wide variety of ways, as persons skilled in the art with the benefit of the description of the invention appreciate. One or more of processor(s) 118 may constitute a digital signal processor (DSP). DSPs allow performing a wide variety of signal processing tasks, such as compression, decompression, audio processing, video processing, filtering, and the like, as desired.

PLD 103 may also include one or more communication circuits 121. Communication circuit(s) 121 may facilitate data and information exchange between various circuits within PLD 103 and circuits external to PLD 103, as persons of ordinary skill in the art who have the benefit of the description of the invention understand.

PLD 103 may further include one or more memories 124 and one or more controller(s) 127. Memory 124 allows the storage of various data and information (such as user-data, intermediate results, calculation results, etc.) within PLD 103. Memory 124 may have a granular or block form, as desired. Controller 127 allows interfacing to, and controlling the operation and various functions of circuitry outside the PLD. For example, controller 127 may constitute a memory controller that interfaces to and controls an external synchronous dynamic random access memory (SDRAM), as desired.

As noted, PLD 103 includes a number of blocks of programmable resources. Implementing a design using those resources often entails routing and placement of those blocks (described below) within PLD 103's floorplan. FIG. 3 shows a floor-plan of an exemplary PLD that one may design or use to implement desired circuits by using the inventive concepts.

The exemplary PLD 103 includes programmable logic 106 arranged as a two-dimensional array. Programmable interconnect 109, arranged as horizontal interconnect and vertical interconnect, couples the blocks of programmable logic 106 to one another. One may place the blocks in a particular manner so as to implement a user's design, as persons of ordinary skill in the art who have the benefit of the description of the invention understand.

In illustrative embodiments, PLD 103 has a hierarchical architecture. In other words, each block of programmable logic 106 may in turn include smaller or more granular programmable logic blocks or circuits. For example, in one embodiment, programmable logic 106 may constitute blocks of configurable logic named logic array block (LAB), and each LAB may include logic elements (LEs) or other circuitry, as desired.

Persons of ordinary skill in the art who have the benefit of the description of the invention understand, however, that a wide variety of other arrangements, with varying terminology and topology, are possible, and fall within the scope of the inventive concepts. Furthermore, although FIG. 3 shows blocks of programmable logic 106, one may use PLDs with other or additional blocks (e.g., memory, processors, other blocks in FIG. 3, etc.) in their floorplans and take advantage of the inventive concepts, as persons of ordinary skill in the art who have the benefit of the description of the invention understand.

Regardless of the particular arrangement or design, however, one may use the inventive concepts in CAD software or programs to exploit the PLD's resources and implement a desired circuit or system. Implementing a user's design in a PLD, such as PLD 103, entails a number of steps or processes, as detailed above.

Congestion estimation of the implementation of a user's design entails using information about the supply of routing wire (generally, rather than wires, one may apply the disclosed techniques with conductors or coupling mechanisms) available in the device, such as a PLD, and an estimate of the routing demand throughout the device.

The quantities of wiring available should be readily available to the CAD tool as one of the properties of the device being used. Determining routing demand is more complex. To do so, the inventive techniques use a proposed location for every logic block in the design. The locations need not be exact or legal. Approximate or overlapping locations are sufficient to create an estimate. For each net (distinct signal originated at one place and routed or coupled to a fanout or one or more destinations) in the design, one estimates how much routing wire it will use as a function of the number of destinations it fans out to, and the minimum rectangular distance the particular net spans (also called its bounding box).

Figure 4:
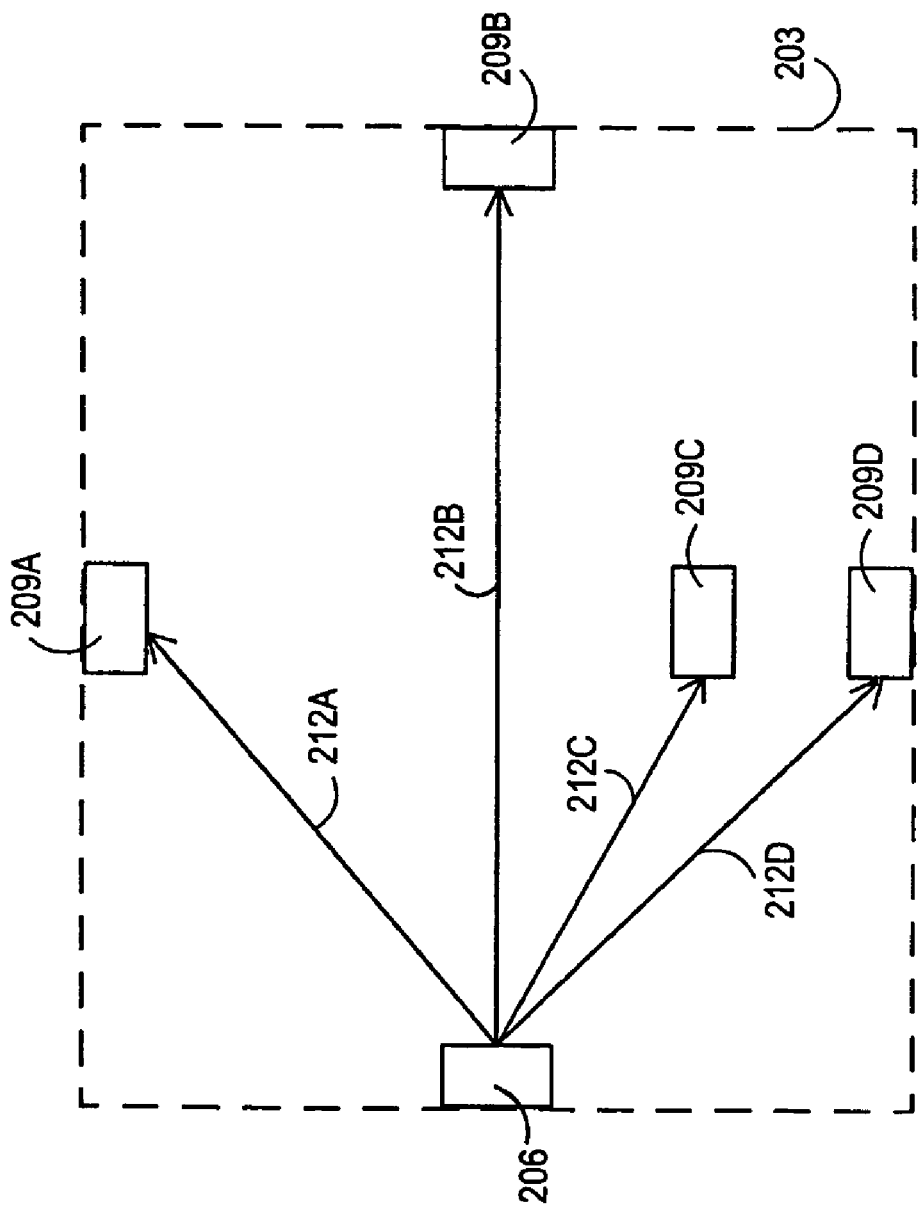
FIG. 4 shows an example of the bounding box used in exemplary embodiments according to the inventive concepts.

FIG. 4 shows an example of the bounding box used in exemplary embodiments. The figure shows bounding box 203 for a net with a fanout of four (labeled as 212A-212D), coupling source block 206 to four destination blocks 209A-209D, respectively. One then allocate the amount of wiring demand for the net across the area spanned by its bounding box. One allocation method is to divide the wire amount across each location covered by the bounding box, in proportion to the amount of wire available at each location. Of course, one may use other allocation schemes, as desired, and as persons of ordinary skill in the art who have the benefit of the description of the invention understand.

This process is repeated for each net in the design. The allocated wiring demand for each net at each location is then summed to determine the total routing demand predicted in each location across the device.

A utilization estimate for any location can then be determined as the ratio between routing demand at that particular location and the routing supply. Thus, for a location having coordinates x and y, one obtains the utilization estimate as:

$$\text{Utilization}(x,y) = \text{Demand}(x,y)/\text{Supply}(x,y)$$

Based on the utilization estimate, a congestion metric or measure can be calculated. An example of a congestion formula might be:

$$\text{Congestion}(x,y) = \max(0, \text{Utilization}(x,y) - 1.0)$$

Note that congestion is predicted in regions where the utilization estimate exceeds the routing supply. Alternative congestion formulations are also possible and may be used, as persons of ordinary skill in the art who have the benefit of the description of the invention understand. Without limitation, examples include scaling factors, square or other mathematical function of the utilization, etc.

Figure 5:
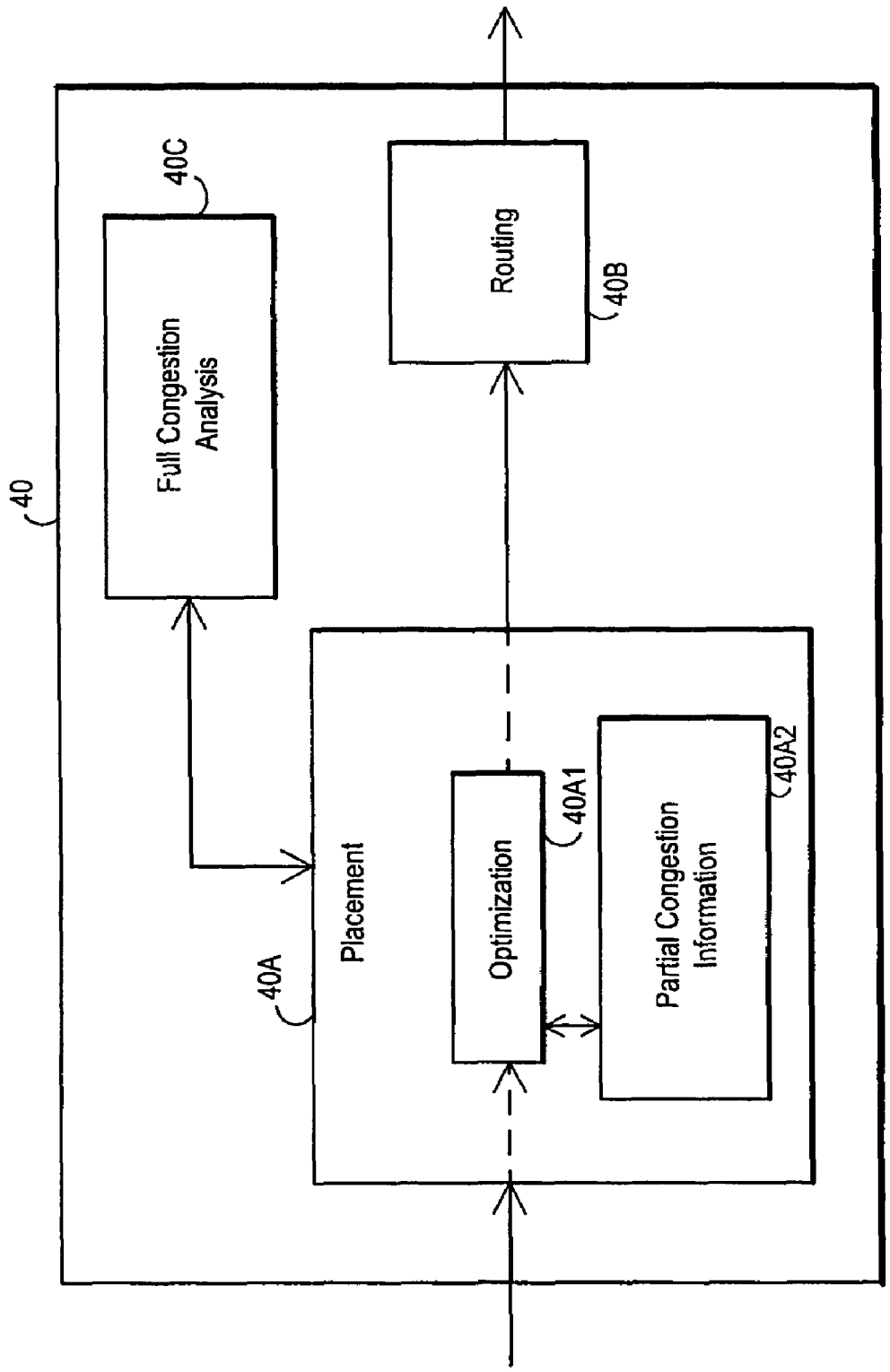
FIG. 5 illustrates a simplified block diagram of place-and-route module 40 according to an exemplary embodiment.

FIG. 5 shows a simplified block diagram of place-and-route module 40 according to an exemplary embodiment. A portion of the information used for congestion analysis is updated incrementally after each placement change. But a full congestion analysis is merely performed periodically, following a larger number of placement moves. This process continues until placement completes and the flow moves onto the routing stage.

As explained in detail below, the congestion cost formula is structured such that it can be calculated and used quickly, without relying on having perfectly up-to-date information. This property allows increased efficiency.

Place-and-route module 40 includes placement module 40A, routing module 40B, full congestion analysis module 40C. Placement module 40A includes optimization module 40A1 and partial congestion information module 40A2, and performs placement of resources within the device.

Optimization module 40A1 receives synthesis information and works on optimizing the placement, using information from partial congestion information module 40A2. Partial congestion information module 40A2 includes partial or incremental (rather than full) congestion information. Optimization module 40A1 provides information regarding congestion conditions to partial congestion information module 40A2.

Optimization module 40A1 provides placement information to full congestion analysis module 40C. Full congestion analysis module performs a full (rather than partial or incremental) congestion analysis, and provides information (e.g., congestion estimate value for each region of the device) to placement module 40A. Optimization module 401A also provides placement information (a particular placement, whether placement is finished, etc., as desired) to routing module 40B. Routing module 40B functions as persons of ordinary skill in the art who have the benefit of the description of the invention understand.

The disclosed inventive techniques seek to minimize the amount of information that is updated incrementally after each placement move. Maintaining an up-to-date view of the bounding box of each net is relatively uncomplicated, and may be performed relatively easily in the placement module (as bounding box size is often used to approximate total wire use).

One can use this information in the congestion algorithm without incurring additional computational overhead. To take advantage of this property, in some embodiments, the congestion formulation for each net is a function of its bounding box, rather than other variables (for example, the wire allocated to every other net that it overlaps).

More specifically, the congestion cost for each net is based on the average congestion seen within its bounding box. The congestion values from the most recently performed full congestion analysis are used. These congestion values are ordinarily not updated as moves are performed. Because each move only affects a relatively small subset of all nets in the design, the total congestion values tend to change relatively slowly.

This property allows one to perform a significant number of moves before re-running a full congestion analysis. Put another way, because the placer's area of focus for congestion optimization is not likely to change after making a single modification, one can make multiple changes before updating this information.

After each analysis, one also decides whether to perform congestion optimization. If the analysis predicts low routing congestion in all regions of the device, then one may omit optimization, and congestion costing can be disabled. Note, however, that the periodic full congestion analysis is still performed. If congestion is predicted later in the placement phase, however, congestion costing can be re-enabled. This is an additional technique to reduce increases in computation time and resource use.

If congestion optimization is to be performed, a data structure is built that allows querying the congestion information relatively quickly in a desired format. Given a congestion estimate for a region with coordinates from (0, 0) to ($x_{max}$, $y_{max}$), a map is constructed that specifies, for each location, the total congestion in the region from (0, 0) to that position. In other words, $$TotalCongestion(x, y) = \sum_{0 \leq x_i < x} \sum_{0 \leq y_j < y} Congestion(x_i, y_j).$$

Figure 6:
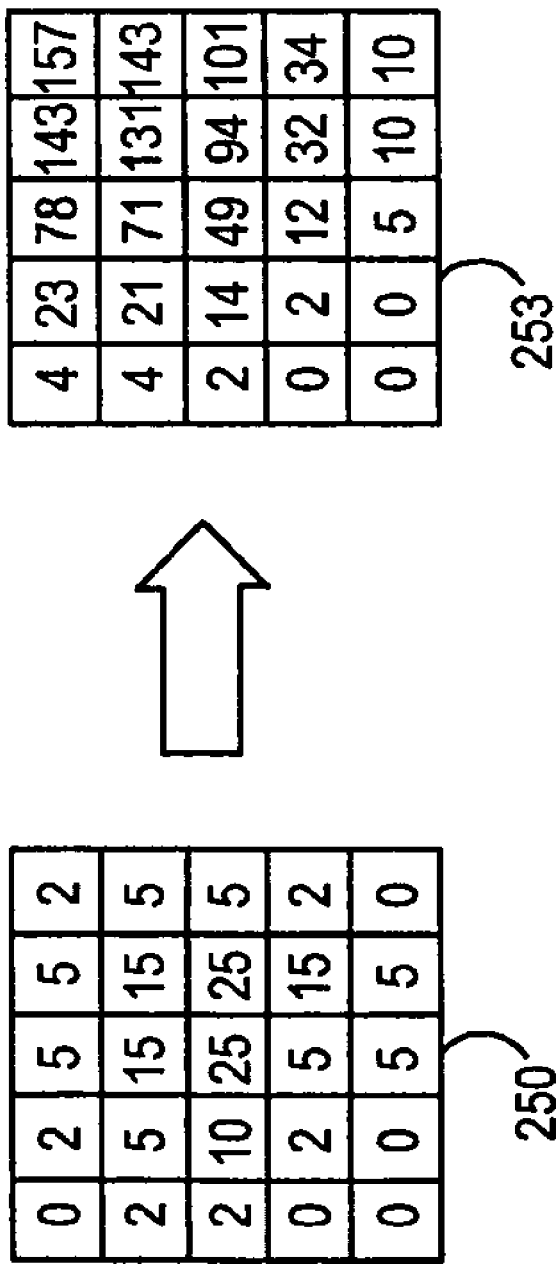
FIG. 6 shows an example of a map corresponding to congestion values in an illustrative region.

FIG. 6 shows an example of a map that would be created, given a map of congestion values in a 5×5 region. Referring to the figure, for each entry, table 253 provides the sum of all congestion values in table 250 from the lower-left corner to the location of that entry. The entry in the upper-right corner is therefore the sum of all the congestion values in table 250.

Figure 7:
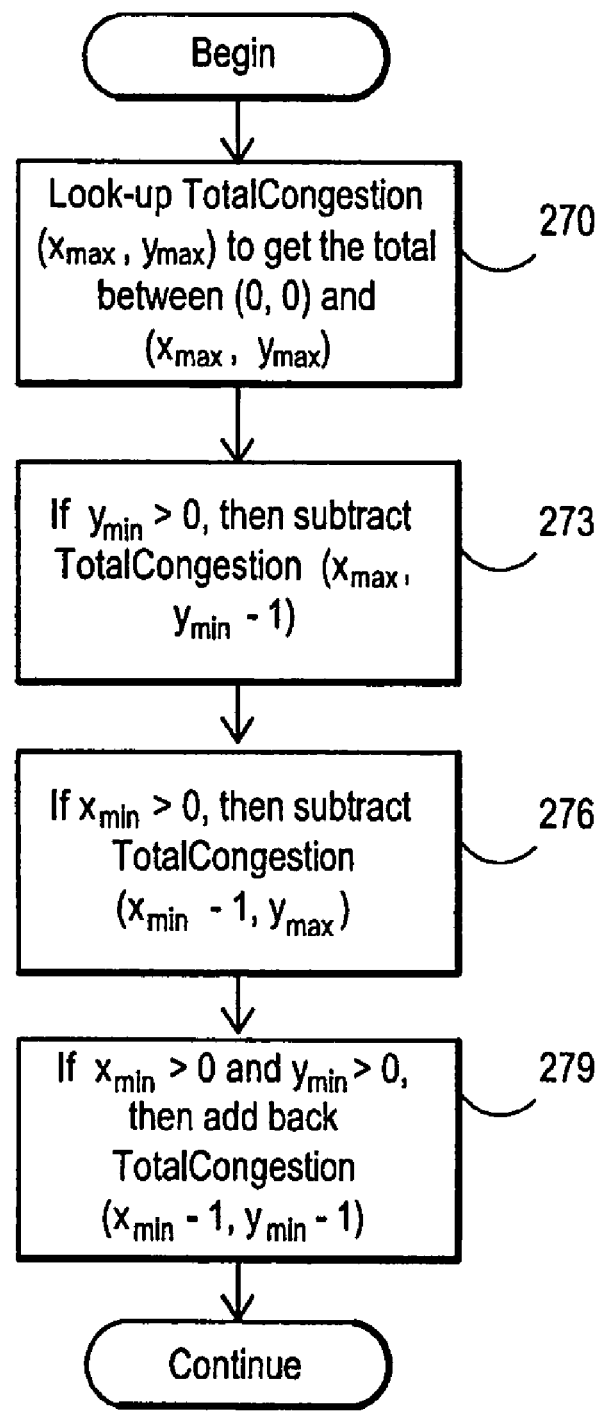
FIG. 7 depicts a simplified flow diagram for a method of calculating congestion for a given region, according to an exemplary embodiment.

The map allows the total congestion seen in any rectangular region in the device to be queried or determined relatively quickly and efficiently. To determine the total congestion in a region from ($x_{min}$, $y_{min}$) to ($x_{max}$, $y_{max}$), one performs the operations shown in FIG. 7.

More specifically, at 270, one TotalCongestion($x_{max}$, $y_{max}$) is looked up or determined in order to obtain the total between (0, 0) and ($x_{max}$, $y_{max}$). At 273, if $y_{min}$ is grater than zero, then TotalCongestion($x_{max}$, $y_{min}$−1) is subtracted from TotalCongestion($x_{max}$, $y_{max}$). At 276, If, subtract TotalCongestion ($x_{min}$−1, $y_{max}$) is subtracted (from the value after 273, i.e., either TotalCongestion($x_{max}$, $y_{max}$) or TotalCongestion($x_{max}$, $y_{max}$) minus TotalCongestion($x_{max}$, $y_{min}$−1)) if $x_{min}$ is greater than zero.

Finally, at 279, if $x_{min}$ is greater than zero and $y_{min}$ is also greater than zero, then TotalCongestion($x_{min}$−1, $y_{min}$−1) is added back to the current value after 276 is performed. Put another way, the operations seek to determine the total value in an arbitrary region of the array. First one obtains the total amount in the region from the origin to the maximum coordinate of the region (i.e., from (0,0) to ($x_{max}$, $y_{max}$) by querying the value at ($x_{max}$, $y_{max}$) in the array). Then, if the lower horizontal edge of the region is not aligned with the edge of the device (and, therefore, the array), one subtracts the total amount that is in the region from the origin to just below the lower edge of the target region (i.e., from (0,0) to ($x_{max}$, $y_{min}$−1)) from the total amount. Similarly, if the lower vertical edge of the region is not aligned with the edge of the array, one also subtracts the amount from (0,0) to ($x_{min}$−1, $y_{max}$) from the total as well. If neither edge is aligned with the device, then one has performed two subtractions and, in doing so, has twice subtracted the amount from (0,0) to ($x_{min}$−1, $y_{min}$−1). So, in that case, the last step is to re-add this amount, by querying the value at ($x_{min}$−1, $y_{min}$−1), in order to arrive at the total amount that is in the desired region.

FIG. 8 shows an example of an application of the above method. The example uses the congestion values from FIG. 6. Of course, as persons of ordinary skill in the art who have the benefit of the description of the invention understand, one may use other values, as desired.

With the method described and the corresponding data structure, the amount of congestion in any rectangular region can be determined with a relatively small, bounded number of memory accesses and mathematical operations. This approach can be used to relatively to quickly calculate the average congestion seen within a net bounding box by querying the total congestion within that box, and then dividing by its area.

A congestion cost is created by summing the average congestion seen by each net. In other words, $$CongestionCost = \sum_{0 \leq i < NumNets} AverageCongestion(Net_i),$$

where AverageCongestion and NumNets denote, respectively, the average congestion seen by each net, and the number of nets.

Moves that reduce the total average congestion are seen as beneficial, and are more likely to be accepted. The cost provided above favors or makes beneficial moving nets away from congested areas, or to at least expand the net around congestion (because increasing the bounding box will tend to decrease average congestion).

Moreover, the cost can be applied in addition to other optimization costs in a global cost function. For example, one may use:

TotalCost=($\alpha$·CongestionCost)+($\beta$FittingCost)+
($\delta$·TimingCost)+ . . .

where $\alpha$, $\beta$, and $\delta$, are weighting factors that determine how relatively important each optimization goal is to the fitting algorithm. The factors can be determined experimentally or empirically to find values that work best for the average design or for a given or particular design, as desired. CongestionCost, FittingCost, and TimingCost represent various metrics that the placer seeks to optimize. As persons of ordinary skill in the art who have the benefit of the description of the invention understand, one may use other or additional metrics, as desired.

CongestionCost is a value that indicates how congested the design is, FittingCost is a value that indicates how well the design will fit in the PLD (for example, as a measure of how much wire it will use), and TimingCost represents a cost that indicates how close one is to meeting the user's timing requirements. The placer works to minimize the value of the TotalCost function (by accepting moves that reduce this value). The above equation shows that, by adjusting the weighting factors $\alpha$, $\beta$, $\delta$, etc., one may control how strongly the placer works to optimize congestion versus timing or other metrics.

Figure 9:
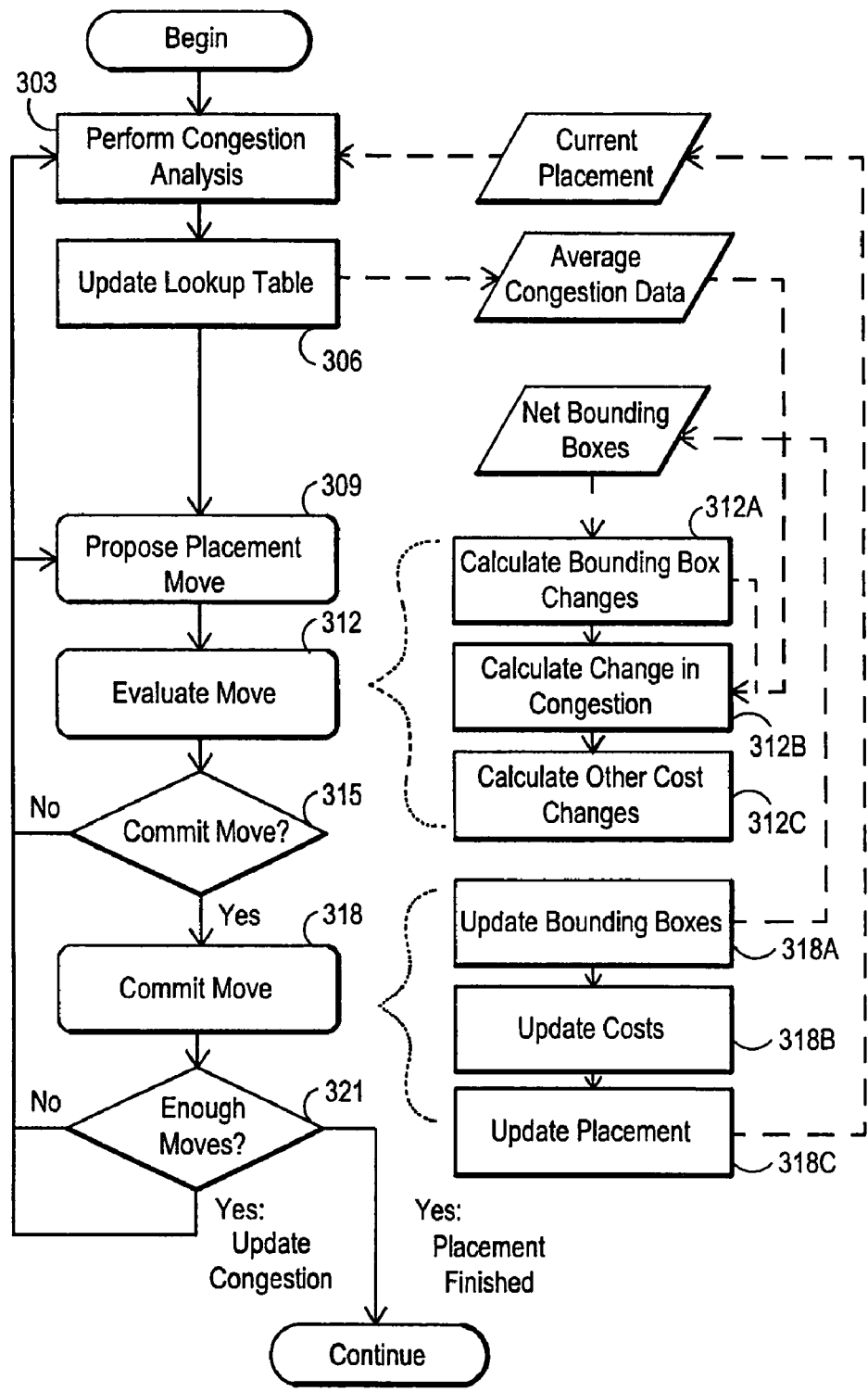
FIG. 9 illustrates a simplified flow diagram for a method of performing placement according to an exemplary embodiment.

FIG. 9 illustrates a simplified flow diagram for a method of performing placement according to an exemplary embodiment. Dashed lines indicate data updates and accesses, using the sources shown in slanted rectangular boxes.

At 303, a full congestion analysis is performed, using an initial seed placement. At 306, the congestion values generated are stored, for example, in a lookup table, to allow the average congestion in any rectangular region to be queried or determined relatively quickly.

Next, at 309, placement moves are proposed. At 312, the placement moves are evaluated. As part of the move evaluation, the bounding boxes for the nets affected by the current move are updated at 312A. At 312B, the bounding box changes are used to calculate the change in average congestion cost for each net, which is used to find the change in congestion cost. At 312C, other costs may be calculated.

This cost is combined with other placement cost changes (as calculated at 312C) to determine at 315 whether the particular move should be committed. If so, at 318 one stores updated bounding boxes for each affected net (at 318A), and records the new placement cost at 318B, including recording the updated congestion cost. At 318C, the placement is updated.

This process continues for some number of moves, which might either be pre-determined, or based dynamically on some property of the current placement, as desired, and as persons of ordinary skill in the art who have the benefit of the description of the invention understand. After the desired or pre-determined number of moves, one performs another full congestion analysis at 303, updates the pertinent data at 306, and so on, as described above. At 321, after some number of repetitions of the loop described above, one will eventually decide to finish the placement phase and move on to routing.

The decision to stop placement may be based on many different factors, as persons of ordinary skill in the art who have the benefit of the description of the invention understand. The decision might be based, for example, on a simple fixed total move limit, a low number of moves now being accepted, or by the current placement, if it satisfies optimization goals (e.g., timing, power, fitting).

In exemplary embodiments, one may enhance the method described above by using directionally weighted averaging. More specifically, one models horizontal and vertical routing resources separately, and generates separate horizontal and vertical congestion maps, as described above.

When calculating the congestion cost for a net, one uses this formulation:

$dx$=BoundingBoxWidth(Net$_i$), $dy$=BoundingBoxHeight(Net$_i$), and

CongestionCost(Net$_i$)={$dx/(dx+dy)$}·AverageHConge-
sion(Net$_i$)+{$dy/(dx+dy)$}·AverageVCongesion
(Net$_i$), where BoundingBoxWidth(Net$_i$) and BoundingBoxHeight (Net$_i$) represent, respectively, the width and height of the bounding box for the ith net. Further, AverageHCongesion (Net$_i$) and AverageHCongesion(Net$_i$) represent the average congestions of the ith net in the horizontal and vertical directions, respectively.

The effect is to give different weights to horizontal or vertical congestion, depending on the topology of the net. For example, a net in a horizontal line or direction will use mostly horizontal routing resources, and therefore will be affected by horizontal congestion. This formulation applies an appropriately higher cost to the horizontal congestion.

Figure 10A:
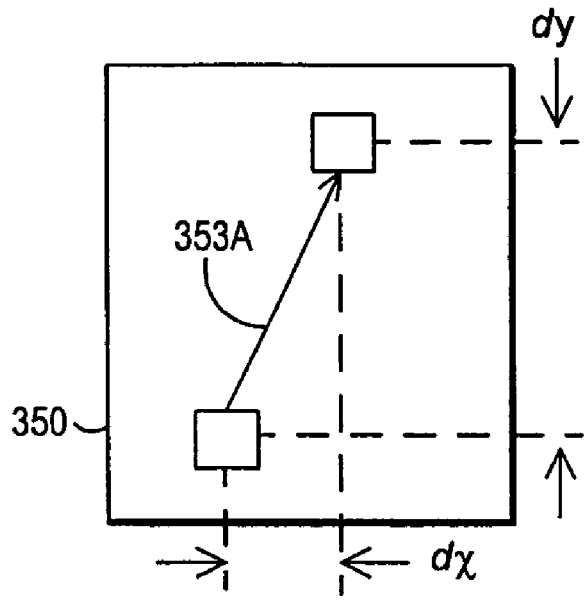
FIG. 10A and FIG. 10B show examples of the different congestion costs of a net depending on the direction of the net.
Figure 10B:
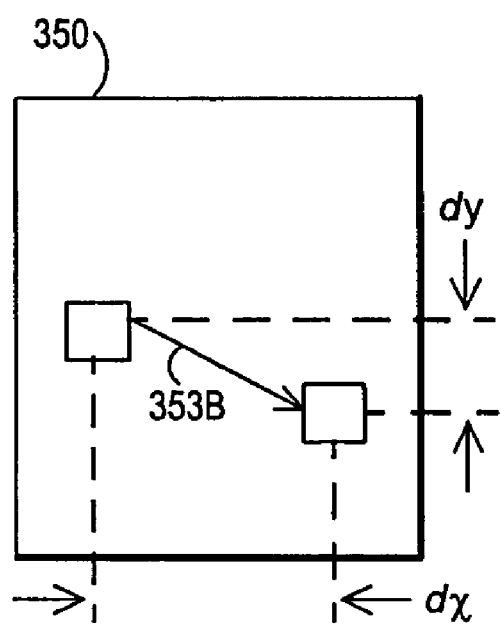

The approach described above also encourages or tends to encourage nets to change their shape depending on the underlying congestion (it influences the topology of the nets). For example, FIGS. 10A and 10B show that, in an area 350, which has high vertical congestion, a net will see an improvement in cost by becoming more horizontal (using horizontally disposed wires), even if the total area that the net spans remains the same. Thus, net 353B in FIG. 10B has a lower cost than does net 353A in FIG. 10A.

In addition, one may employ incremental modeling to enhance the placement method according to exemplary embodiments. As noted, the disclosed techniques use an up-to-date view of the bounding box for each net. There are other placement characteristics that are simpler to model than a full congestion model, which nonetheless may be used to improve congestion modeling accuracy.

For example, the locations of terminals can be used to predict congestion, as each net terminal represents a location where routing wire is used. A terminal constitutes the source or destination of a net connection or coupling. Each net has one source terminal, and one or more destination terminals.

So, counting the number of terminals in a region is equivalent to counting the number of connections or couplings that start or end in a region. A region with a relatively large number of terminals is more likely to experience congestion than one with no or relatively few terminals. Thus, one may augment the disclosed methods by also monitoring the number of terminals used in regions across the device, and apply a penalizing cost to regions with overly or relatively high terminal usage.

This approach improves an approach that merely uses periodic congestion analysis. For example, if the congestion analysis indicates that a single region has relatively high congestion, the placement algorithm will likely attempt to move logic or circuitry from that congested region to less congested neighboring areas. As moves are performed the congestion is reduced. But the placement algorithm receives no feedback on whether the appropriate amount of logic or circuitry has been moved until the next congestion analysis is performed.

If the congestion analysis is performed too infrequently, the placer may overcompensate for this congestion and cause the previously non-congested regions to become overly or relatively congested in the next step. Modeling terminal counts helps to prevent this oscillatory effect by decreasing the benefit seen to moving logic or circuitry as more moves are performed.

Figure 11:
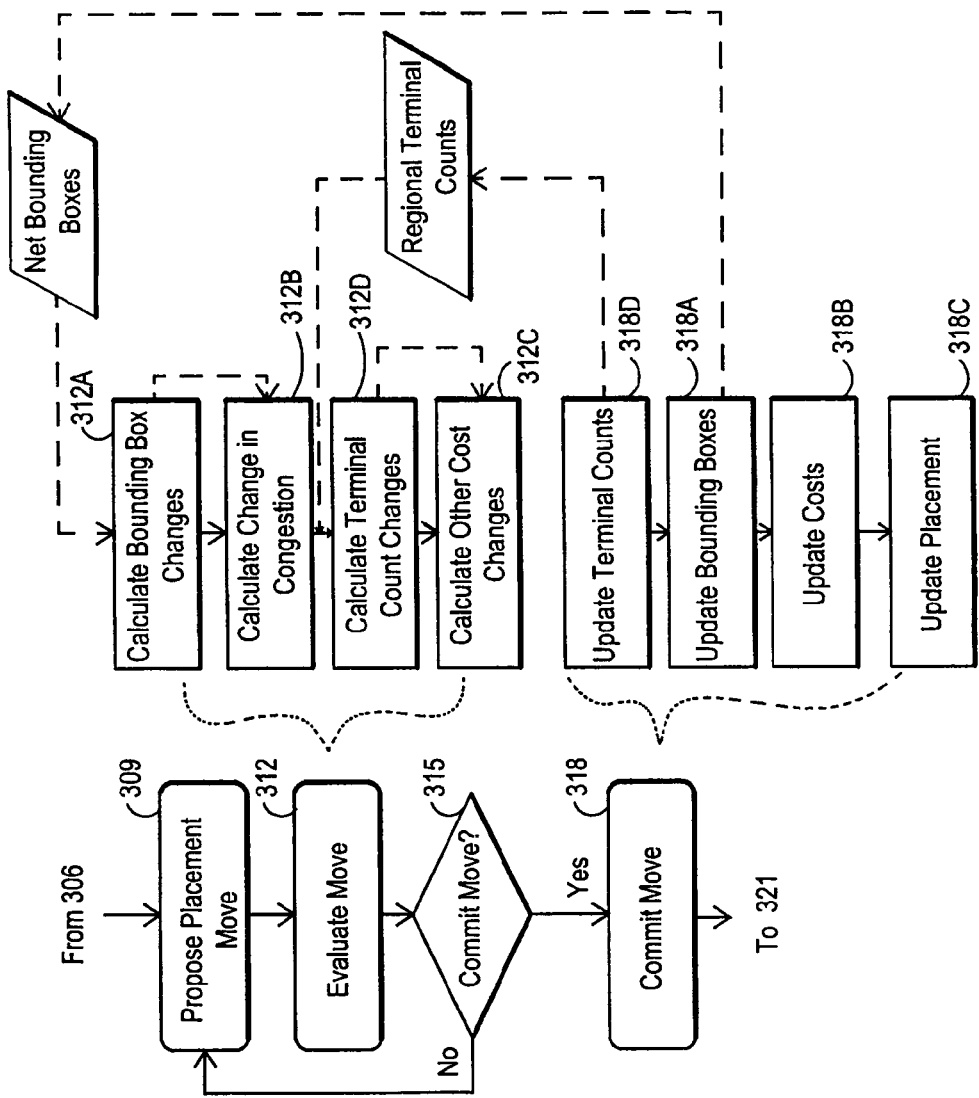
FIG. 11 depicts a simplified flow diagram for a method of incremental modeling for improved congestion analysis.

FIG. 11 depicts a simplified flow diagram for a method of incremental modeling for improved congestion analysis. Note that FIG. 11 illustrates complements FIG. 9 by showing the modifications made to FIG. 9 to implement terminal counts.

Referring to FIG. 11, in addition to storing the bounding box of each net, a count of the number of net terminals in each region of the device is also stored. When evaluating a placement move at 312, the change in terminal counts in each of these regions is calculated at 312D, and is used to compute an additional cost, based on some threshold for the number of terminals allowed in each region. If a move is committed, the change in terminal counts is committed, and the updated terminal count stored at 318D. Note that the enhancements shown in FIG. 11 do not change the congestion cost changes shown in FIG. 9, some of which are not explicitly shown in FIG. 11.

In addition, in exemplary embodiments, results from the periodic congestion analysis may also be used to provide congestion-driven moves. In other words, the results may be used to guide the placer to making specific moves, which are targeted to reducing congestion. For example, the placer can be guided to move blocks that are currently in highly congested regions, and propose locations that are in less congested areas. Doing so should decrease or tend to decrease the average congestion seen by bounding boxes of that net, thus reducing the congestion cost more quickly than with purely random, or non-congestion-focused moves.

Figure 12:
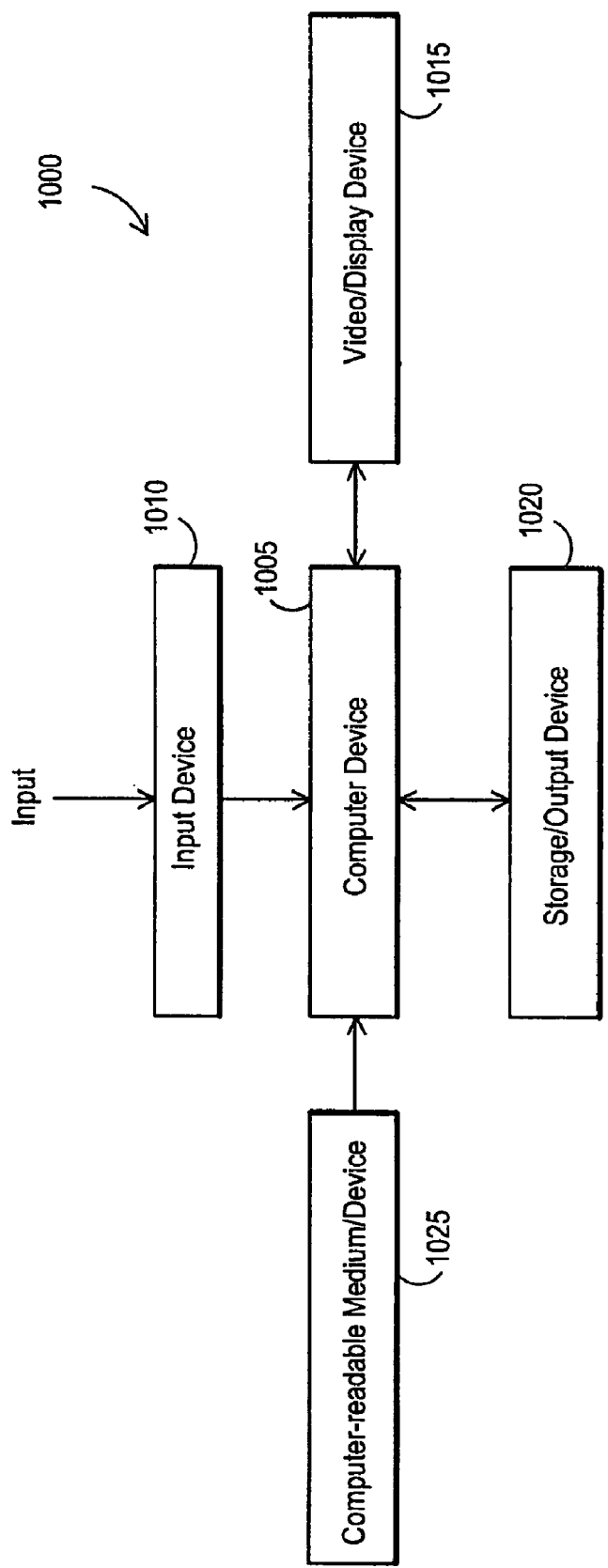
FIG. 12 shows a block diagram of an exemplary system for processing information according to the invention.

As noted above, one may run or execute algorithms or software according to the invention on computer systems or processors. FIG. 12 shows a block diagram of an exemplary system for processing information according to the invention.

System 1000 includes a computer device 1005, an input device 1010, a video/display device 1015, and a storage/output device 1020, although one may include more than one of each of those devices, as desired.

The computer device 1005 couples to the input device 1010, the video/display device 1015, and the storage/output device 1020. The system 1000 may include more that one computer device 1005, for example, a set of associated computer devices or systems, as desired.

The system 1000 operates in association with input from a user. The user input typically causes the system 1000 to perform specific desired information-processing tasks, including circuit simulation. The system 1000 in part uses the computer device 1005 to perform those tasks. The computer device 1005 includes an information-processing circuitry, such as a central-processing unit (CPU), although one may use more than one CPU or information-processing circuitry, as persons skilled in the art would understand.

The input device 1010 receives input from the user and makes that input available to the computer device 1005 for processing. The user input may include data, instructions, or both, as desired. The input device 1010 may constitute an alphanumeric input device (e.g., a keyboard), a pointing device (e.g., a mouse, roller-ball, light pen, touch-sensitive apparatus, for example, a touch-sensitive display, or tablet), or both. The user operates the alphanumeric keyboard to provide text, such as ASCII characters, to the computer device 1005. Similarly, the user operates the pointing device to provide cursor position or control information to the computer device 1005.

The video/display device 1015 displays visual images to the user. The visual images may include information about the operation of the computer device 1005, such as graphs, pictures, images, and text. The video/display device may constitute a computer monitor or display, a projection device, and the like, as persons of ordinary skill in the art would understand. If a system uses a touch-sensitive display, the display may also operate to provide user input to the computer device 1005.

The storage/output device 1020 allows the computer device 1005 to store information for additional processing or later retrieval (e.g., softcopy), to present information in various forms (e.g., hardcopy), or both. As an example, the storage/output device 1020 may constitute a magnetic, optical, or magneto-optical drive capable of storing information on a desired medium and in a desired format. As another example, the storage/output device 1020 may constitute a printer, plotter, or other output device to generate printed or plotted expressions of the information from the computer device 1005.

The computer-readable medium 1025 interrelates structurally and functionally to the computer device 1005. The computer-readable medium 1025 stores, encodes, records, and/or embodies functional descriptive material. By way of illustration, the functional descriptive material may include computer programs, computer code, computer applications, and/or information structures (e.g., data structures or file systems). When stored, encoded, recorded, and/or embodied by the computer-readable medium 1025, the functional descriptive material imparts functionality. The functional descriptive material interrelates to the computer-readable medium 1025.

Information structures within the functional descriptive material define structural and functional interrelations between the information structures and the computer-readable medium 1025 and/or other aspects of the system 1000. These interrelations permit the realization of the information structures' functionality. Moreover, within such functional descriptive material, computer programs define structural and functional interrelations between the computer programs and the computer-readable medium 1025 and other aspects of the system 1000. These interrelations permit the realization of the computer programs' functionality.

By way of illustration, the computer device 1005 reads, accesses, or copies functional descriptive material into a computer memory (not shown explicitly in the figure) of the computer device 1005. The computer device 1005 performs operations in response to the material present in the computer memory. The computer device 1005 may perform the operations of processing a computer application that causes the computer device 1005 to perform additional operations. Accordingly, the functional descriptive material exhibits a functional interrelation with the way the computer device 1005 executes processes and performs operations.

Furthermore, the computer-readable medium 1025 constitutes an apparatus from which the computer device 1005 may access computer information, programs, code, and/or applications. The computer device 1005 may process the information, programs, code, and/or applications that cause the computer device 1005 to perform additional operations.

Note that one may implement the computer-readable medium 1025 in a variety of ways, as persons of ordinary skill in the art would understand. For example, memory within the computer device 1005 may constitute a computer-readable medium 1025, as desired. Alternatively, the computer-readable medium 1025 may include a set of associated, interrelated, coupled (e.g., through conductors, fibers, etc.), or networked computer-readable media, for example, when the computer device 1005 receives the functional descriptive material from a network of computer devices or information-processing systems. Note that the computer device 1005 may receive the functional descriptive material from the computer-readable medium 1025, the network, or both, as desired.

Note that one may apply the inventive concepts effectively to various ICs that include ICs with programmable or configurable circuitry, known by other names in the art, as desired, and as persons skilled in the art with the benefit of the description of the invention understand. Such circuitry include, for example, devices known as complex programmable logic device (CPLD), programmable gate array (PGA), field programmable gate array (FPGA), and structured application specific ICs, or structured ASICs, as noted above.

Referring to the figures, persons of ordinary skill in the art will note that the various blocks shown may depict mainly the conceptual functions and signal flow. The actual circuit implementation may or may not contain separately identifiable hardware for the various functional blocks and may or may not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have the benefit of the description of the invention understand. Other modifications and alternative embodiments of the invention in addition to those described here will be apparent to persons of ordinary skill in the art who have the benefit of the description of the invention. Accordingly, this description teaches those skilled in the art the manner of carrying out the invention and are to be construed as illustrative only.

The forms of the invention shown and described should be taken as the presently preferred or illustrative embodiments. Persons skilled in the art may make various changes in the shape, size and arrangement of parts without departing from the scope of the invention described in this document. For example, persons skilled in the art may substitute equivalent elements for the elements illustrated and described here. Moreover, persons skilled in the art who have the benefit of this description of the invention may use certain features of the invention independently of the use of other features, without departing from the scope of the invention.

The invention claimed is:

1. A method of performing placement of resources in a computer-aided design (CAD) tool, the method comprising:
   performing, using a computer, a first congestion analysis;
   proposing, using a computer, a placement move;
   evaluating, using a computer, the placement move; and
   using the computer to incrementally update information used for performing a second congestion analysis.

2. The method according to claim 1, wherein evaluating the placement move comprises evaluating, using the computer, a congestion cost for a net based on a bounding box of the net.

3. The method according to claim 2, wherein the congestion cost for the net comprises an average congestion information of its bounding box.

4. The method according to claim 3, wherein the average congestion information is structured efficiently to minimize calculations.

5. The method according to claim 1, wherein the information used for performing the second congestion analysis is minimized.

6. The method according to claim 1, further comprising using the computer to selectively perform congestion optimization based on congestion levels.

7. The method according to claim 6, wherein performing congestion optimization further comprises using the computer to determine respective congestion levels of a set of rectangular regions.

8. The method according to claim 1, wherein evaluating the placement move comprises calculating, using the computer, respective bounding box changes of a set of nets.

9. The method according to claim 8, wherein evaluating the placement move further comprises calculating, using the computer, an average congestion cost for each net in the set of nets.

10. The method according to claim 8, wherein calculating an average congestion cost for each net in the set of nets comprises using the computer to perform directionally weighted averaging.

11. The method according to claim 1, wherein evaluating the placement move comprises calculating, using the computer, a change in a terminal count within a set of regions.

12. The method according to claim 1, wherein proposing the placement move comprises by using information from the first congestion analysis to propose a move that reduces average congestion.

13. A system for performing placement of resources in a computer-aided design (CAD) tool, the system comprising:
   a computer, configured to:
      perform a first congestion analysis;
      propose a placement move;
      evaluate the placement move; and
      incrementally update information used for performing a second congestion analysis.

14. The system according to claim 13, wherein the computer is further configured to evaluate the placement move by evaluating a congestion cost for a net based on a bounding box of the net.

15. The system according to claim 14, wherein the congestion cost for the net comprises an average congestion of its bounding box.

16. The system according to claim 15, wherein the average congestion information is structured efficiently to minimize calculations.

17. The system according to claim 13, wherein the computer is further configured to minimize information used for performing the second congestion analysis.

18. The system according to claim 13, wherein the computer is further configured to selectively perform congestion optimization based on congestion levels.

19. The system according to claim 18, wherein the computer is configured to perform congestion optimization by determining respective congestion levels of a set of rectangular regions.

20. The system according to claim 13, wherein the computer is further configured to evaluate the placement move by calculating respective bounding box changes of a set of nets.

21. The system according to claim 20, wherein the computer is further configured to evaluate the placement move by calculating an average congestion cost for each net in the set of nets.

22. The system according to claim 20, wherein the computer is further configured to calculate an average congestion cost for each net in the set of nets by performing directionally weighted averaging.

23. The system according to claim 13, wherein the computer is further configured to evaluate the placement move by calculating a change in a terminal count within a set of regions.

24. The system according to claim 13, wherein the computer is further configured to propose the placement move by using information from the first congestion analysis to propose a move that reduces average congestion.

25. A computer-readable medium, comprising:
a computer application adapted for processing by a computer to perform placement of resources in a computer-aided design (CAD) tool, the computer application configured to cause the computer to:
perform a first congestion analysis;
propose a placement move;
evaluate the placement move; and
incrementally update information used for performing a second congestion analysis.

26. The computer-readable medium according to claim 25, wherein the computer application is further configured to cause the computer to evaluate the placement move by evaluating a congestion cost for a net based on a bounding box of the net.

27. The computer-readable medium according to claim 26, wherein the congestion cost for the net comprises an average congestion of its bounding box.

28. The computer-readable medium according to claim 25, wherein the computer application is further configured to cause the computer to minimize information used for performing the second congestion analysis.

29. The computer-readable medium according to claim 25, wherein the computer application is further configured to cause the computer to selectively perform congestion optimization based on congestion levels.

30. The computer-readable medium according to claim 29, wherein the computer application is configured to cause the computer to perform congestion optimization by determining respective congestion levels of a set of rectangular regions.

31. The computer-readable medium according to claim 25, wherein the computer application is further configured to cause the computer to evaluate the placement move by calculating respective bounding box changes of a set of nets.

32. The computer-readable medium according to claim 31, wherein the computer application is further configured to cause the computer to evaluate the placement move by calculating an average congestion cost for each net in the set of nets.

33. The computer-readable medium according to claim 31, wherein the computer application is further configured to cause the computer to calculate an average congestion cost for each net in the set of nets by performing directionally weighted averaging.

34. The computer-readable medium according to claim 25, wherein the computer application is further configured to cause the computer to evaluate the placement move by calculating a change in a terminal count within a set of regions.

35. The computer-readable medium according to claim 25, wherein the computer application is further configured to cause the computer to propose the placement move by using information from the first congestion analysis to propose a move that reduces average congestion.

* * * * *